(12) United States Patent
Chang

(10) Patent No.: US 6,500,711 B1
(45) Date of Patent: Dec. 31, 2002

(54) FABRICATION METHOD FOR AN INTERPOLY DIELECTRIC LAYER

(75) Inventor: Kent Kuohua Chang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/078,034

(22) Filed: Feb. 15, 2002

(30) Foreign Application Priority Data

Feb. 1, 2002 (TW) .................................... 091101732 A

(51) Int. Cl.[7] .............................................. H01L 21/336
(52) U.S. Cl. ...................................................... 438/257
(58) Field of Search ................................ 438/257, 261, 438/211, 201

(56) References Cited

U.S. PATENT DOCUMENTS 5,946,542 A * 8/1999 Iyer ................................ 438/7
6,303,481 B2 * 10/2001 Park ............................. 438/591
6,323,141 B1 * 11/2001 Wu et al. ....................... 438/788
6,350,390 B1 * 2/2002 Liu et al.

FOREIGN PATENT DOCUMENTS

JP           07029898    *  1/1995

* cited by examiner

*Primary Examiner*—Long Pham
(74) *Attorney, Agent, or Firm*—J.C. Patents

(57) ABSTRACT

A fabrication method for an interpoly dielectric layer, wherein the method provides a substrate having a first polysilicon layer already formed thereon. An interpoly dielectric layer is then formed on the first polysilicon layer, wherein the interpoly dielectric layer is formed using an argon gas/oxygen gas/ammonia gas plasma, a krypton gas/oxygen gas/ammonia gas plasma, an argon gas/oxygen gas plasma or a krypton gas/oxygen gas plasma. After this, a second polysilicon layer is formed on the interpoly dielectric layer.

24 Claims, 2 Drawing Sheets

US 6,500,711 B1

FABRICATION METHOD FOR AN INTERPOLY DIELECTRIC LAYER

CROSS-REFERENCE TO RELATED APPLICATION

This application claims the priority benefit of Taiwan application Ser. No. 91101732, filed Feb. 1, 2002.

BACKGROUND OF THE INVENTION

1. Field of the Invention

The present invention relates to a fabrication method for a semiconductor device. More particularly, the present invention relates to a fabrication method for an interpoly dielectric layer.

2. Background of the Invention

Flash memory is an electrically erasable and programmable read-only memory (EEPROM) that is widely used in computer and microprocessor systems for permanently storing information that are repeatedly read, written or erased. Moreover, flash memory can retain information even when power is interrupted. Flash memory is a type of non-volatile memory (NVM), which is small in size, faster in reading/programming speed and consumes less power and energy. Since the erasure of information for a flash memory is accomplished "block-by-block", the operational speed is also faster.

FIGS. 1A to 1C are schematic diagrams in cross-sectional views illustrating the fabrication of a flash memory device according to the prior art.

As shown in FIG. 1A, a substrate 100 is provided, wherein a tunnel oxide layer 102 is formed on the substrate 100. A patterned polysilicon layer 104, serving as a floating gate, is formed on the tunnel oxide layer 102. A buried drain region 106 is then formed in the substrate 100 beside the side of the polysilicon layer 104.

Referring to FIGS. 1B to 1C, a dielectric layer 108 is formed on the substrate 100. After this, another polysilicon layer 110, serving as the control gate, is formed on the dielectric layer 108 that is on the polysilicon layer 104.

The dielectric layer 108 is formed by, for example, a thermal process. The thermal process is conducted at a temperature of about 900 degrees Celsius in an oxygen environment to induce a reaction between the oxygen molecules and the silicon atoms of the polysilicon layer 104 to form an oxide type of dielectric layer 108. However, the surface of the dielectric layer 108 formed by the conventional thermal process is rough. A rough surface would cause a current leakage between the two polysilicon layers 104, 110. Moreover, the dielectric layer 108 that is formed by the conventional thermal process is at a temperature of about 900 degrees Celsius. Under such a high temperature, the dopants of the buried drain region 106 in the substrate 100 would diffuse into the tunnel oxide layer 102, causing a current leakage.

Additionally, in the conventional approach, in order to increase the sustainability to high electric field, a silicon oxide-silicon nitride-silicon oxide (ONO) stacked layer or an silicon oxide-silicon nitride (ON) stacked layer is used as the interpoly dielectric layer 108 for the flash memory device. However, forming the ONO stacked layer or the ON stacked layer requires multiple process steps greatly increases the complexity of the manufacturing process.

SUMMARY OF THE INVENTION

The present invention provides a fabrication method for an interpoly dielectric layer, wherein an interpoly dielectric layer having a rough surface formed by the conventional thermal process is prevented.

The present invention also provides a fabrication method for an interpoly dielectric layer, wherein the problem encountered in forming an interpoly dielectric layer that can sustains a higher electric field as in the prior art is prevented.

The prevent invention further provides a fabrication method for a flash memory device, wherein the diffusion of dopants from the buried drain in the substrate to the tunnel oxide layer due to the high temperature in forming the interpoly dielectric layer is prevented.

The present invention additionally provides a fabrication method for an interpoly dielectric layer of a flash memory device in which current leakage is reduced to increase the reliability of the device.

The present invention provides a fabrication method for an interpoly dielectric layer, wherein the method provides a substrate having a first polysilicon layer already formed thereon. An interpoly dielectric layer is then formed on the first polysilicon layer. The interpoly dielectric layer is formed under a temperature of about 400 degrees Celsius, using an argon gas/oxygen gas/ammonia gas plasma, a krypton gas/oxygen gas/ammonia gas plasma, an argon gas/oxygen gas plasma or a krypton gas/oxygen gas plasma. The composition ratio of argon gas to oxygen gas to ammonia gas in the argon gas/oxygen gas/ammonia gas plasma is 96.5:3:0.5. The composition ratio of krypton gas to oxygen gas to ammonia gas in the krypton gas/oxygen gas/ammonia gas plasma is about 96.5:3:0.5. The composition ratio of argon gas to oxygen gas in the argon gas/oxygen gas plasma is 97:3. The composition ratio of krypton gas to oxygen gas in the krypton gas/oxygen gas plasma is 97:3.

The present invention provides a fabrication method for a flash memory device. This method provides a substrate, and a tunnel oxide layer is formed on the surface of the substrate. A patterned first polysilicon layer is then formed on the tunnel oxide layer as the floating gate. A buried drain region is the formed in the substrate beside the first polysilicon layer. A dielectric layer is then formed on the first polysilicon layer as the interpoly dielectric layer, wherein the dielectric layer is formed at a temperature of about 400 degrees Celsius using an argon gas/oxygen gas/ammonia gas plasma, a krypton gas/oxygen gas/ammonia gas plasma, an argon gas/oxygen gas plasma or a krypton gas/oxygen gas plasma. The composition ratio of argon gas to oxygen gas to ammonia gas in the argon gas/oxygen gas/ammonia gas plasma is 96.5:3:0.5. The composition ratio of krypton gas to oxygen gas to ammonia gas in the krypton gas/oxygen gas/ammonia gas plasma is about 96.5:3:0.5. The composition ratio of argon gas to oxygen gas in the argon gas/oxygen gas plasma is 97:3. The composition ratio of krypton gas to oxygen gas in the krypton gas/oxygen gas plasma is 97:3. A second polysilicon layer is then formed on the dielectric layer as the control gate.

In accordance of the fabrication method for an interpoly dielectric layer of the present invention, the oxygen ions in the plasma exhibits no lattice orientation dependency, the interpoly dielectric layer is thus more uniformly formed.

According to the fabrication method for an interpoly dielectric layer of the present invention, the oxygen ions in the plasma is smaller in size and thus diffuse faster through the polyoxide growing film to react with the silicon atoms to form the interpoly dielectric layer. The growing of the inter-poly dielectric layer to the desired thickness can thus be faster and at a lower temperature.

According to the present invention, only a single process step is required to obtain an interpoly dielectric layer that is sustainable to high electric field. The complexity of the manufacturing process is thereby reduced.

According to the fabrication method for a flash memory device of the present invention, the interpoly dielectric layer is formed at a temperature of about only 400 degrees Celsius. A diffusion of dopants from the buried doped drain in the substrate to the tunnel oxide layer is thus obviated.

The interpoly dielectric layer of a flash memory device formed according to the present invention reduces the occurrences of a current leakage to increase the reliability of a device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
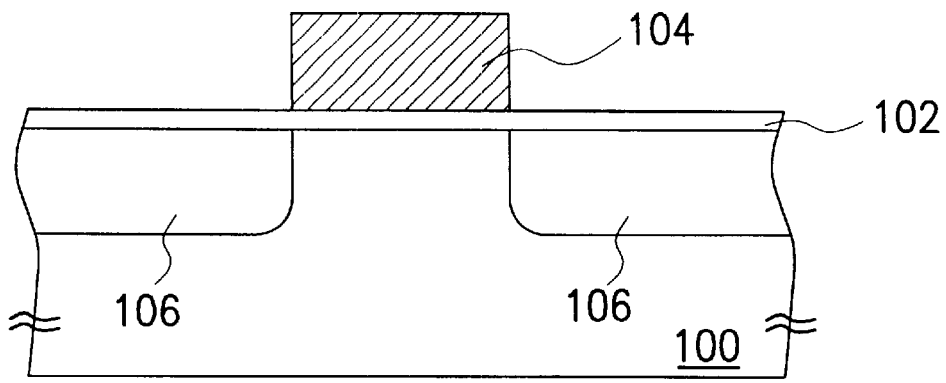
FIGS. 1A to 1C are schematic diagrams in cross-sectional view illustrating the fabrication for a flash memory device according to the prior art.
Figure 1B:
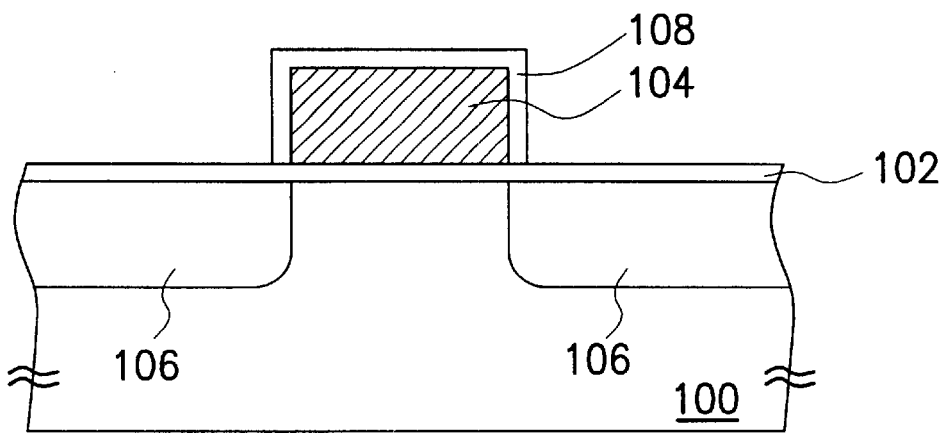
Figure 1C:
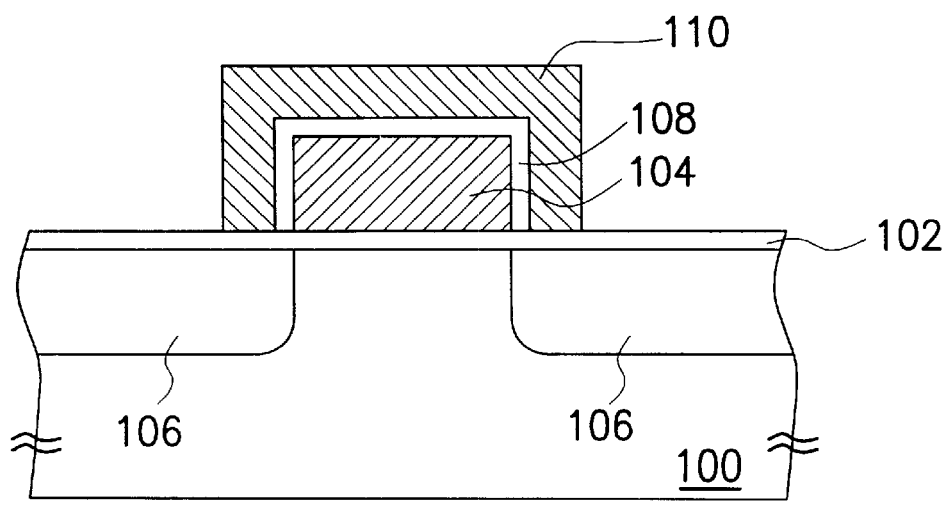
Figure 2A:
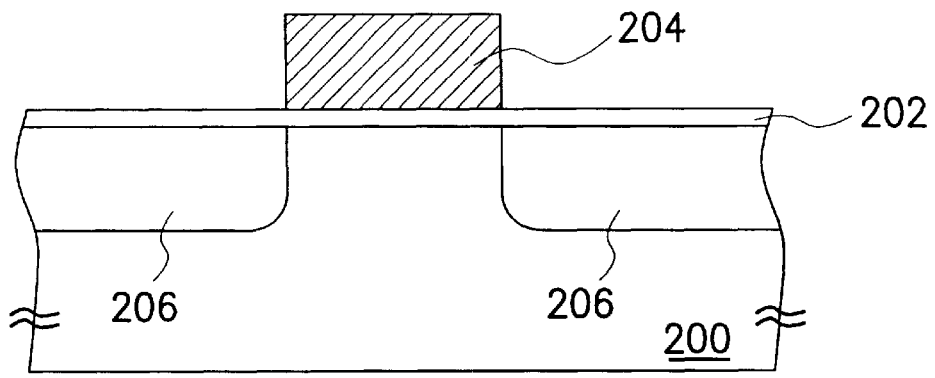
FIGS. 2A to 2C are schematic diagrams in cross-sectional view illustrating the fabrication method for a flash memory device according the embodiment of the present invention.
Figure 2B:
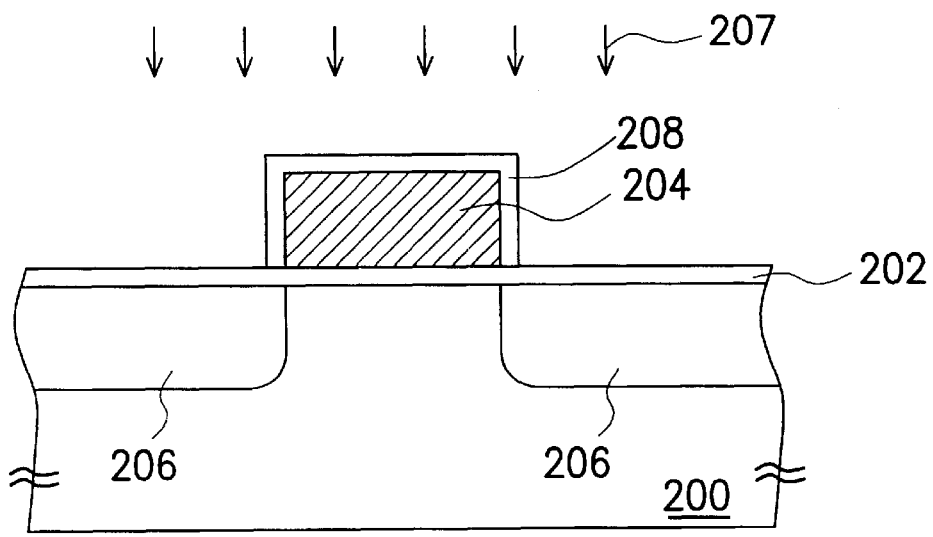
Figure 2C:
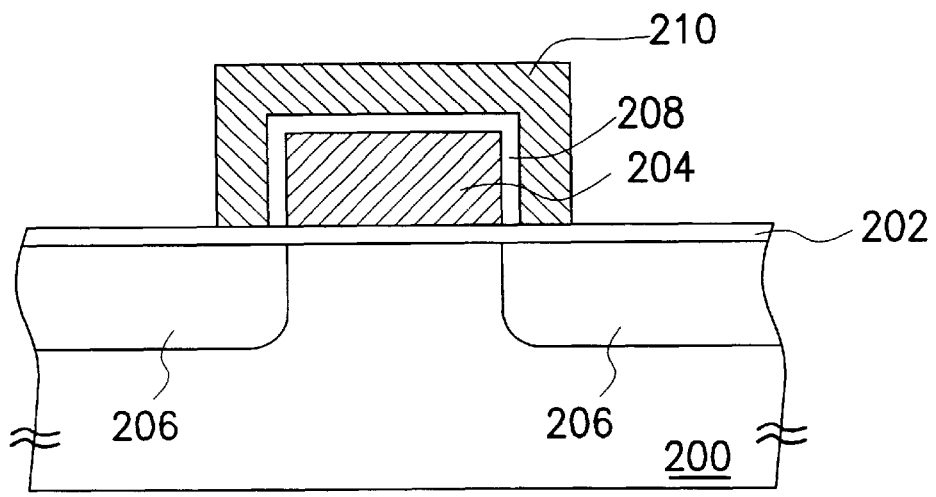

FIGS. 2A to 2C are schematic diagrams in cross-sectional view illustrating the fabrication method for a flash memory device according the embodiment of the present invention.

As shown in FIG. 2A, a substrate 200 is provided. A tunnel oxide layer 202 is formed on the substrate 200. A patterned polysilicon layer 204 is formed on the tunnel oxide layer 202 as a floating gate. Using the polysilicon layer 204 as an implantation mask, an ion implantation is conducted to form a buried drain region 206 in the substrate 200 beside the polysilicon layer 204.

Referring to FIG. 2B, a dielectric layer 208 is formed on the substrate 200, covering the polysilicon layer 204. The dielectric layer 208 is served as an interpoly dielectric layer.

The dielectric layer 208 is formed by plasma 207 that uses a gas mixture of an inert gas and an oxygen gas and ammonia gas as the gas source and at a temperature of about 400 degrees Celsius. In this embodiment, the inert gas includes argon gas or krypton gas. When an argon gas/oxygen gas/ammonia gas is used as the gas source of the plasma 207, The composition ratio of argon gas to oxygen gas to ammonia gas is, for example, 96.5:3:0.5. When a krypton gas/oxygen gas/ammonia gas is used as the gas source of the plasma 207, the composition ratio of krypton gas to oxygen gas to ammonia gas in the krypton gas/oxygen gas/ammonia gas plasma is about 96.5:3:0.5. The inert gas (either argon or krypton) is used to bombard the oxygen gas or the ammonia gas. The oxygen molecules and the ammonia molecules are ionized to form the oxygen ions and the nitrogen ions. A polyoxynitride type of dielectric layer 208 is thus formed due to a reaction between the oxygen ions and the nitrogen ions with the silicon atoms of the polysilicon layer. Similar to the conventional ONO stacked layer or the ON stacked layer, the polyoxynitride type of dielectric layer 208 is also sustainable to high electric field. Additionally, the dielectric layer 208 of the present invention is formed in a single process step, which is much simpler than the fabrication for a conventional ONO stacked layer or ON stacked layer.

Moreover, the dielectric layer 208 of the present invention can formed by a plasma 207 using a mixture of an inert gas and an oxygen gas as the gas source at a temperature of about 400 degrees Celsius. In the present embodiment, the inert gas includes an argon gas or a krypton gas. When an argon gas/oxygen gas mixture is used as a gas source for the plasma, the composition ratio of argon gas to oxygen gas in the argon gas/oxygen gas plasma is 97:3. When a krypton gas/oxygen gas mixture is used as the gas source for the plasma, the composition ratio of krypton gas to oxygen gas is 97:3. The inert gas (either argon or krypton) is used to bombard the oxygen gas, ionizing the oxygen molecule into oxygen ions. The oxygen ions are then reacted with the silicon atoms to form a polyoxide dielectric layer 208.

Thereafter, as shown in FIG. 2C, another polysilicon layer 210 is formed as the control gate on the dielectric layer 208 overlying the polysilicon layer 204. The fabrication for a flash memory device is thereby completed.

An important point that is worth noting is that the dielectric layer formed by the plasma method of the present invention is only at a temperature of about 400 degrees Celsius. Compare to the conventional 900 degrees Celsius processing temperature, not only the thermal budget for the entire process is reduced, the diffusion of the dopants from the buried drain 206 to the tunnel oxide layer 202 is also being prevented. Moreover, the present invention relies on the reaction between the oxygen ions/nitrogen ions and the silicon atoms, the dielectric layer 208 formed according to the present invention is thus more uniform because the reactivity of silicon with oxygen ions exhibits no lattice orientation dependency. Moreover, the dielectric layer 208 formed by the plasma method of the present invention has a smoother surface than the oxide layer formed by the conventional thermal process. The dielectric layer 208 formed according to the present invention can thus mitigate the current leakage problem occurred between the polysilicon layers 204, 210.

Since the oxygen ions in the plasma exhibit no lattice orientation dependency, the interpoly dielectric layer that is formed according to the present invention is more uniform.

Further, the oxygen ions in the plasma is smaller in size, and thereby diffuse faster through the growing polyoxide film to react with the silicon atoms. As a result, forming the interpoly dielectric layer can be accomplished in a shorter time at a lower temperature.

Further, according to the fabrication method of the present invention, an interpoly dielectric layer that has a high electric field sustainability can be formed with only one process step to greatly reduce the complexity of the manufacturing process.

According to the fabrication method for a flash memory device of the present invention, the interpoly dielectric layer is formed only at a temperature of 400 degrees Celsius, the diffusion of dopants from the buried drain region to the tunnel oxide layer is prevented.

Additionally, the occurrence of a current leakage is reduced to greatly increase the reliability of a device according to the fabrication method for an inter-poly dielectric layer and the fabrication of a flash memory device of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for an interpoly dielectric layer, comprising:

providing a substrate having a first polysilicon layer formed thereon;

performing a plasma treatment upon the first polysilicon layer using a gas mixture of an inert gas with an oxygen gas and an ammonia gas as a gas in such composition ratio of inert gas to oxygen gas and a temperature condition that the inert gas ionizes the oxygen gas into oxygen ions, which oxygen ions reacts with silicon atoms of said first polysilicon layer to form an interpoly dielectric layer; and forming a second polysilicon layer on the interpoly dielectric layer.

2. The method of claim 1, wherein the temperature of the plasma treatment is about 400 degrees Celsius.

3. The method of claim 1, wherein the inert gas includes an argon gas.

4. The method of claim 3, wherein when using the gas mixture of the argon gas, the oxygen gas and the ammonia gas as the gas source, the composition ratio of the argon gas to the oxygen gas to the ammonia gas is 96.5:3:0.5.

5. The method of claim 1, wherein the inert gas includes a krypton gas.

6. The method of claim 5, wherein when using the gas mixture of the krypton gas, the oxygen gas and the ammonia gas as the gas source, the composition ratio of the krypton gas to the oxygen gas to the ammonia gas is 96.5:3:0.5.

7. A fabrication method for an interpoly dielectric layer, comprising:

providing a substrate having a first polysilicon layer already formed thereon;

performing a plasma treatment upon the first polysilicon layer using a gas mixture of an inert gas and an oxygen gas as a gas source in such composition ratio of inert gas to oxygen gas and a temperature condition that the inert gas ionizes the oxygen gas into oxygen ions, which oxygen ions reacts with silicon atoms of said first polysilicon layer to form an interpoly dielectric layer; and forming a second polysilicon layer on the interpoly dielectric layer.

8. The method of claim 7, wherein the temperature of the plasma treatment is about 400 degrees Celsius.

9. The method of claim 7, wherein the inert gas includes an argon gas.

10. The method of claim 9, wherein when using the gas mixture of the argon gas and the oxygen gas as the gas source, the composition ratio of the argon gas to the oxygen gas is 97:3.

11. The method of claim 7, wherein the inert gas includes a krypton gas.

12. The method of claim 11, wherein when using the gas mixture of the krypton gas and the oxygen gas as the gas source, the composition ratio of the krypton gas to the oxygen gas is 97:3.

13. A fabrication method for a flash memory device, comprising:

providing a substrate having a tunnel oxide layer already formed thereon;

forming a floating gate on the tunnel oxide layer;

forming a buried drain region in the substrate beside the side of the floating gate;

performing a plasma treatment upon the floating gate using a mixture of an inert gas, an oxygen gas and an ammonia gas as a gas source in such composition ratio of inert gas to oxygen gas and a temperature condition that the inert gas ionizes the oxygen gas into oxygen ions, which oxygen ions reacts with silicon atoms of said floating gate to form a dielectric layer; and forming a control gate on the dielectric layer.

14. The method of claim 13, wherein the temperature of the plasma treatment is about 400 degrees Celsius.

15. The method of claim 13, wherein the inert gas includes an argon gas.

16. The method of claim 15, wherein when using the gas mixture of the argon gas, the oxygen gas and the ammonia gas as the gas source, the composition ratio of the argon gas to the oxygen gas to the ammonia gas is 96.5:3:0.5.

17. The method of claim 13, wherein the inert gas includes a krypton gas.

18. The method of claim 17, wherein when using the gas mixture of the krypton gas, the oxygen gas and the ammonia gas as the gas source, the composition ratio of the krypton gas to the oxygen gas to the ammonia gas is 96.5:30.5.

19. A fabrication method for a flash memory device, comprising:

providing a substrate having a tunnel oxide layer already formed thereon;

forming a floating gate on the tunnel oxide layer;

forming a buried drain region in the substrate beside the side of the floating gate;

performing a plasma treatment upon the floating gate using a mixture of an inert gas and an oxygen gas as a gas source in such composition ratio of inert gas to oxygen gas and a temperature condition that the inert gas ionizes the oxygen gas into oxygen ions, which oxygen ions reacts with silicon atoms of said floating gate to form a dielectric layer; and forming control gate on the dielectric layer.

20. The method of claim 19, wherein the temperature of the plasma treatment is about 400 degrees Celsius.

21. The method of claim 19, wherein the inert gas includes an argon gas.

22. The method of claim 21, wherein when using the gas mixture of the argon gas and the oxygen gas as the gas source, the composition ratio of the argon gas to the oxygen gas is 97:3.

23. The method of claim 19, wherein the inert gas includes a krypton gas.

24. The method of claim 23, wherein when using the gas mixture of the krypton gas and the oxygen gas as the gas source, the composition ratio of the krypton gas to the oxygen gas is 97:3.

* * * * *